United States Patent [19]

Brody

[11] 4,139,908

[45] Feb. 13, 1979

[54] PHOTOVOLTAIC-FERROELECTRIC DATA RECORDER

[75] Inventor: Philip S. Brody, Brookmont, Md.

[73] Assignee: The United States of America as represented by the Secretary of the Army, Washington, D.C.

[21] Appl. No.: 824,894

[22] Filed: Aug. 15, 1977

Related U.S. Application Data

[63] Continuation-in-part of Ser. No. 533,365, Dec. 16, 1974, Pat. No. 4,051,465, which is a continuation-in-part of Ser. No. 411,853, Nov. 1, 1973, Pat. No. 3,855,004.

[51] Int. Cl.² ............................................. G11C 11/42
[52] U.S. Cl. ................................. 365/117; 365/106; 365/109; 179/100.1 B
[58] Field of Search ................ 358/236; 365/109, 106, 365/117, 45; 179/100.1 B

[56] References Cited

U.S. PATENT DOCUMENTS

| 2,775,650 | 12/1956 | Mason et al. | 179/100.1 |
| 3,609,002 | 9/1971 | Fraser | 365/109 |
| 3,681,765 | 8/1972 | Chapman | 365/109 |
| 3,693,171 | 9/1972 | Asam | 365/109 |
| 3,740,734 | 6/1973 | Maldonado | 365/109 |

*Primary Examiner*—Terrell W. Fears
*Attorney, Agent, or Firm*—Nathan Edelberg; Robert P. Gibson; Saul Elbaum

[57] ABSTRACT

A data recording and read-out apparatus and method in which a ferroelectric ceramic substrate is remanently polarized to store information. Upon being illuminated, the substrate produces a photovoltaic voltage, which is detected to effect read-out. A disk of ferroelectric ceramic material to which information is entered by spiral tracking, either in a single track or in multiple tracks. A self-scanning data record comprised of a plurality of ferroelectric ceramic cells which are remanently polarized, and which are read out by a register.

14 Claims, 8 Drawing Figures

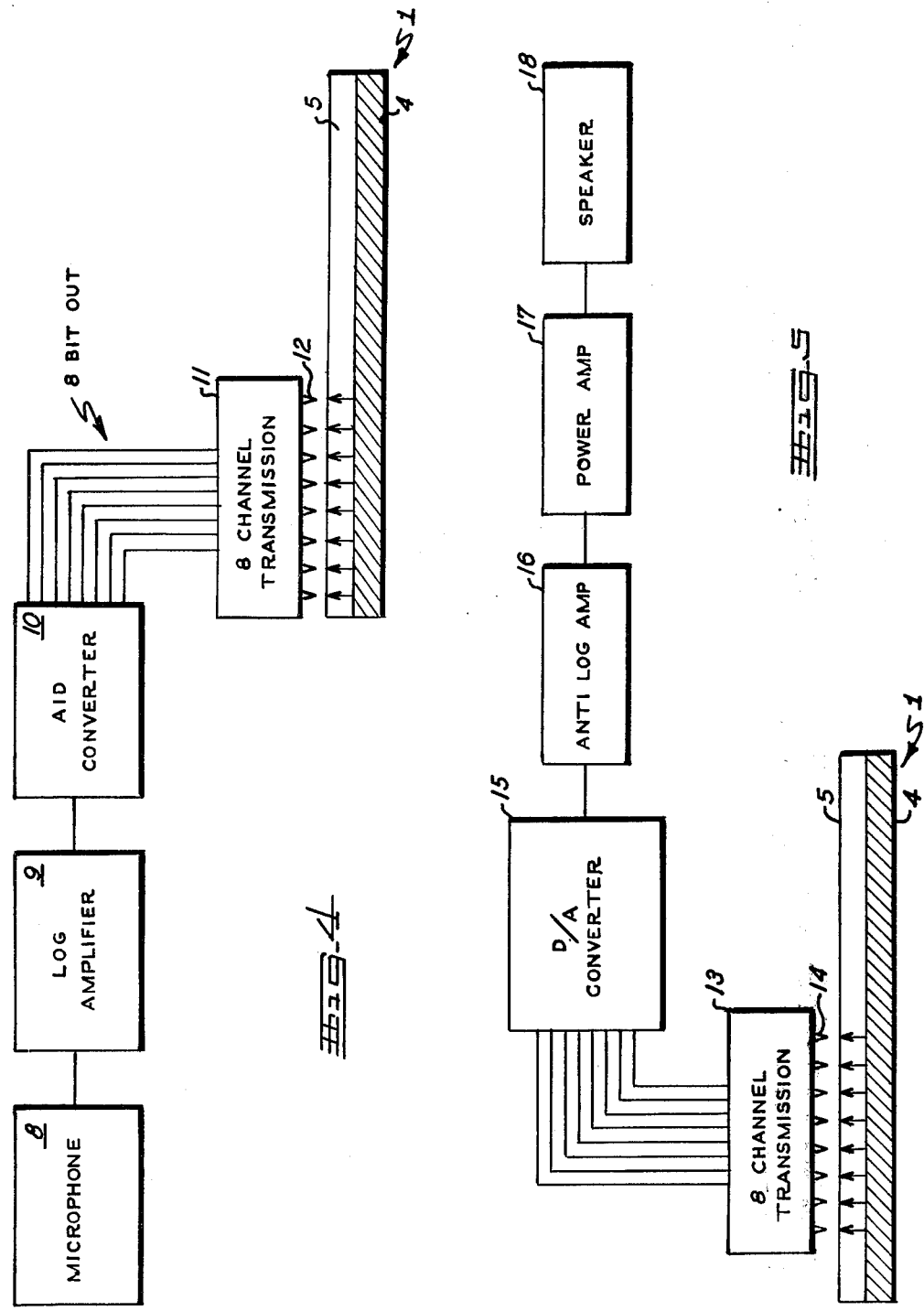

PHOTOVOLTAIC-FERROELECTRIC DATA RECORDER

RIGHTS OF THE GOVERNMENT

The invention described herein may be manufactured, used, and licensed by or for the United States Government for governmental purposes without the payment to me of any royalty thereon.

The present application is a continuation-in-part of U.S. Patent Application No. 533,365, filed Dec. 16, 1974, now U.S. Pat. No. 4,051,465, incorporated herein by reference, which in turn is a continuation-in-part of application Ser. No. 411,853 filed Nov. 1, 1973 and now U.S. Pat. No. 3,855,004, also incorporated herein by reference.

As disclosed in the above-mentioned patent and patent application, the inventor has discovered that the class of materials known as ceramic ferroelectrics, if remanently polarized, will produce a photovoltaic voltage upon being illuminated. The reader is referred to the above-mentioned patent documents for the details of this phenomenon, but briefly, the voltage output of the material is of a polarity corresponding to the direction of the remanent polarization and is of a magnitude proportional to both the amplitude of the remanent polarization and the length of the ferroelectric material.

The present invention in its broadest aspect is directed generally to a data recording and readout apparatus and method employing the above phenomenon, and in its more specific aspects, is directed to a disk recording and readout apparatus and self-scanning data record.

In general, one of the advantages of the invention is that it provides a storage and retrieval device which affords both relatively high density storage and a relatively fast accessing time.

The disk recording apparatus provided by the present invention possesses advantages over prior art disk systems. By way of background, disk recording and readout systems in general have been known for many years and are most frequently found in the well known vinyl phonograph disk which is both cut and read-out by mechanical as opposed to electrical or optical means. Because of the inherent limitations of the mechanical mode, conventional record disks have been limited as to the density of information which can be stored, and additionally have the disadvantage of becoming scratched or damaged by wear.

While magnetic tape has supplanted vinyl disks to a certain extent, especially where high quality audio reproduction, and video reproduction is desired, tape too is susceptible to surface wear, and has the further significant disadvantage that it must be replicated by re-recording rather than by a contact replication process, such as is used in the case of vinyl disks. This accounts for the higher price of magnetic tapes.

For several years, there has been an effort to develop a charge deposition or capacitive recording system in which charge is deposited directly on the surface of an insulating tape, which acts like a capacitor. The pickup in this type of system is a non-contacting probe which tracks the tape. The advantage of this system is that it affords higher density than the vinyl disk, and in comparison to conventional magnetic tape, can afford a large number of tracks. However, the problem is that the charge is not permanent and leaks off over a period of time, and this is probably why such systems have not been commercialized.

In distinction to the above, the present invention provides a disk made of a ferrolectric ceramic material which is recorded by being remanently polarized within its bulk by a polarizing electrical signal, and which is read out by the detection of a photovoltaic output voltage which is produced when the disk is illuminated. This system affords a unique combination of characteristics and advantages not found in the prior art. Since it provides a high density storage capability, more information can be stored and a correspondingly higher bandwidth can be obtained than with either the vinyl disk or magnetic tape, and since the information is stored in the bulk of the material rather than on the surface, there is no wear problem as with conventional disks and tape. Like the charge depositions system the present invention permits the use of a large number of recording tracks, but unlike the prior art system, information storage is permanent as opposed to temporary. Finally, the disk of the present invention has the significant advantage of being capable of being replicated by a contact process, and further, may permit both recording and read out on the same turntable in situations where this may be advantageous.

It is thus an object of the invention to provide a new data recording and readout apparatus and method employing a newly discovered phenomenon.

It is a further object of the invention to provide an improved disk recording and read out apparatus.

It is a further object of the invention to provide a disk which may be recorded by either digital or analog signals and which may be utilized either as an audio disk or a video disk.

It is still a further object of the invention to provide a data recording and readout apparatus which is capable of high density storage of information.

It is still a further object of the invention to provide a data record which is not subject to the problem of surface wear or damage.

It is still a further object of the invention to provide a recording and readout apparatus which can employ a large number of tracks or channels.

It is still a further object of the invention to provide a data record which can be easily and inexpensively replicated.

It is still a further object of the invention to provide a self-scanning data record.

The invention will be better understood by referring to the accompanying drawings in which:

FIG. 4 is a representation of a multi-channel data recording arrangement according to the invention.

FIG. 5 is a representation of a multi-channel data recording arrangement according to the invention.

Figure 1:
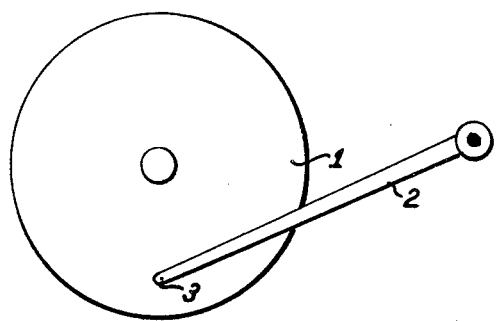
FIG. 1 is a pictorial illustration of a disk data recording arrangement according to the invention.
Figure 2:
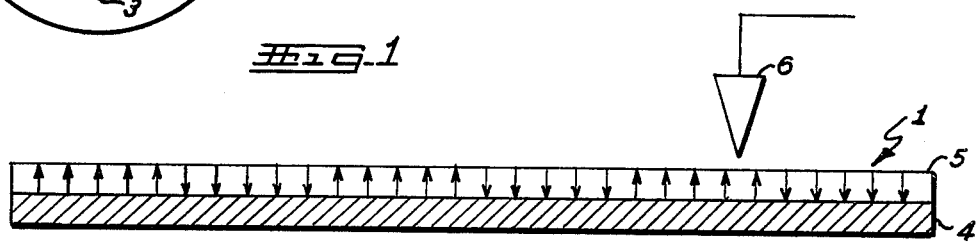
FIG. 2 is a cross-sectional view of the ceramic ferroelectric disk shown in FIG. 1.

Referring to FIG. 1, data is entered into disk 1 by stylus 6 which is on the end of tracking arm 2. Disk 1 is in the shape of a conventional audio disk and as shown in cross-section in FIG. 2, is comprised of bottom conducting substrate 4 which is coated with ferroelectric ceramic material layer 5. Coating 5 may be made of any appropriate ferroelectric ceramic material, and for a more detailed discussion of appropriate materials, see the above-identified co-pending patent and patent application. As an illustrative example, the material PZT-5 may be used.

Data is entered into the sheet by the application of a voltage between a point on the insulating ceramic surface and a conducting plane. The voltage may be applied by using a contacting stylus such as shown at 6, or by an equivalent method, such as by using an electron beam, non-contacting stylus, ion beam, or other method. Access to points on the disk is by spiral tracking as in a conventional audio disk playback unit using a pre-cut groove, a lead screw, or other method to track the input voltage point in a spiral path on the surface of the record rotating beneath the head. The mechanics of such an arrangement are considered to be well known to those skilled in the art, and are therefore not disclosed in detail in the present application. The exemplary information shown as being entered to the disk in FIG. 2 is an arbitrary pattern of alternating remanent polarization directions. It is significant to note that since the magnitude of the remanent polarization which is produced in a ferroelectric ceramic material is proportional to the amplitude of the voltage applied, analog as well as digital information can be entered into the disk.

The playback signal is in the form of a modulated voltage proportional to the remanent polarization appearing between the conducting substrate and a contacting or non-contacting stylus, moving in the same path as the stylus which entered the data. The playback voltage is produced when the surface of the disk is illuminated by a source of an appropriate wavelength, and the voltage which is detected results from a charge density $\sigma(r)$ which appears on the insulating surface.

Figure 3:
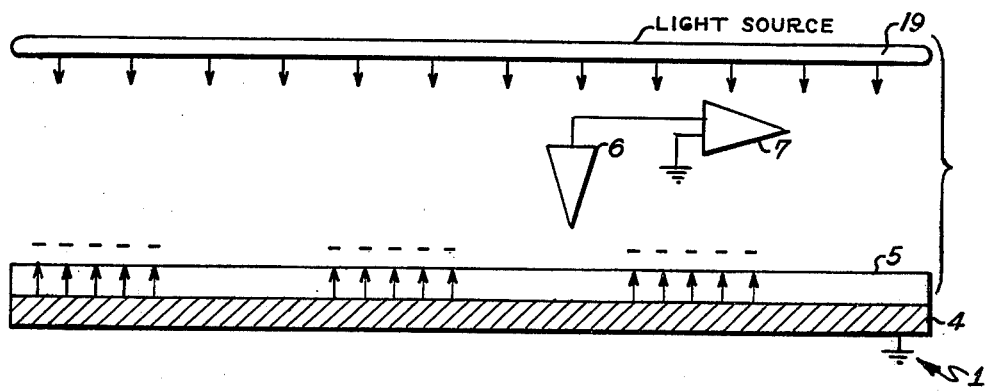
FIG. 3 is a representation of a data playback arrangement according to the invention.

An illustrative playback arrangement is shown in FIG. 3 wherein the surface of the disk is illuminated by lamp 19 and the voltage is picked up by contacting probe 6, and is fed to appropriate amplification circuitry 7. It is noted that a positive voltage appears at the portions of the disk in which a remanent polarization has been created by a positive polarizing voltage.

The illumination used for playback can be continuous, can be turned on just preceding playback or can be periodically applied with sufficient average intensity to maintain the photo-induced surface charge. For photovoltaic ferroelectric ceramic materials such as PZT, PLZT, BaTiO$_3$, etc., this wavelength is in the deep violet or ultraviolet region, and the wavelength and intensity determines the rate of surface charging. As an example, lamp 19 may be a conventional fluorescent tube with the phosphor used to produce illumination peaked in the 370 UV region.

If a non-contacting stylus is used for playback, it detects a voltage induced by the surface charge density $\sigma(r)$ utilizing a voltage to current converter, and if a contacting stylus is used, the surface charge density $\sigma(r)$ is discharged through the input of a current to voltage converter. In that case, the charge density reappears rising at a rate defined by a charging time constant $\tau_c$. In either case, the charge density vanishes as a result of leakage when the illumination is removed and the dark discharge time constant $\tau_d$ is generally much greater than $\tau_c$. The above allows for continuous playback, even if detection is by the discharge mode.

In addition to the photo-voltages described above, pyroelectric voltages generally produced by incidental heating, for instance due to the illumination, are also present. These are in the same direction as the photovoltages, and thus produce similar effects. The pyroelectric voltages however, are produced by the thermally induced changes in the remanent polarization, and thus are an increment in the total surface charge, and are not constantly renewed by the illumination or heat. They decay with time as the result of resistive paths to ground, and alone do not provide a suitable source of voltage or charge for playback. For efficient photovoltage producing radiation, the pyroelectric voltage produced incidently by a temperature increment should be much less than the photo-voltage.

An illustrative embodiment of a multi-channel recording system is shown in FIG. 4, and a corresponding embodiment of a multi-channel playback system is shown in FIG. 5. Referring to FIG. 4, it is seen that multi-channel probe assembly 11 has a plurality of information inputting probes 12, and in the drawing, 8 channels and probes are shown. At the input, a signal is originated by microphone 8, or other signal source, and is fed to signal compression logarithmic amplifier 9, and from there to analog-to-digital converter 10, since the illustrated system is ditigal. The digital signals are then inputted to probe assemble 11, where eight concentric spiral channels are recorded.

For playback, as is shown in FIG. 5, pickup probe assembly 13 includes eight probes 14, and the signals picked up are fed through digital-to-analog converter 15, anti-log amplifier 16, and power amplifier 17, to speaker 18, or to some other desired output device. Instead of the anti-log amplifier, pulse modulation in combination with a Class D amplifier, or other arrangement known to those skilled in the art, can be used.

As mentioned above, one of the advantages of the ceramic disk of the present invention is that it can be replicated by a contact process. For a more detailed discussion of this, the reader is referred to co-pending U.S. Application No. 824,895 filed Aug. 15, 1977.

Figure 6:
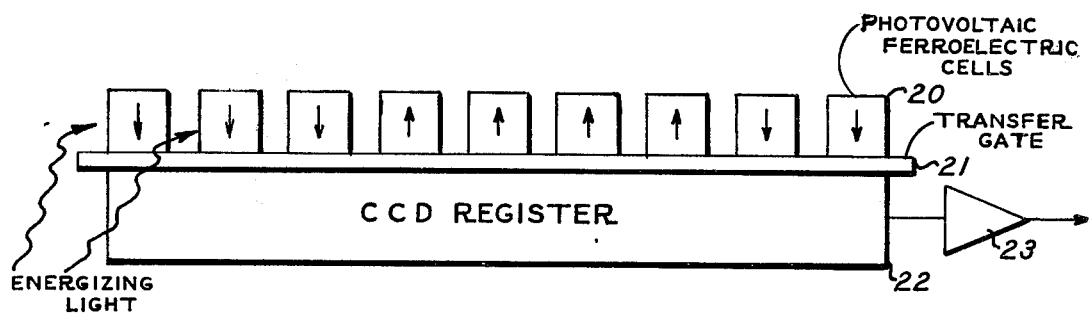
FIGS. 6 to 8 are representations of self-scanning arrangements according to the invention.
Figure 7:
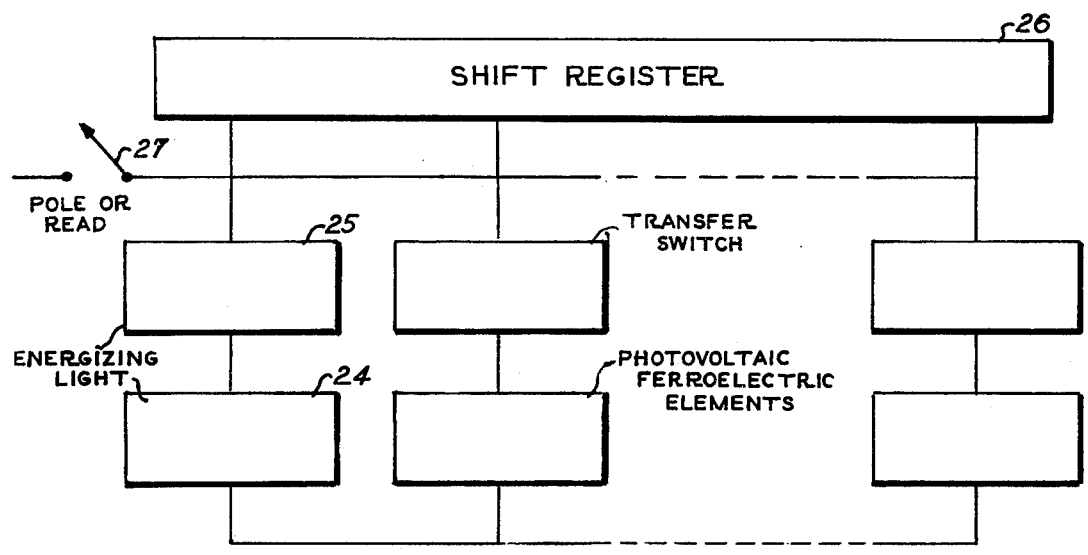
Figure 8:
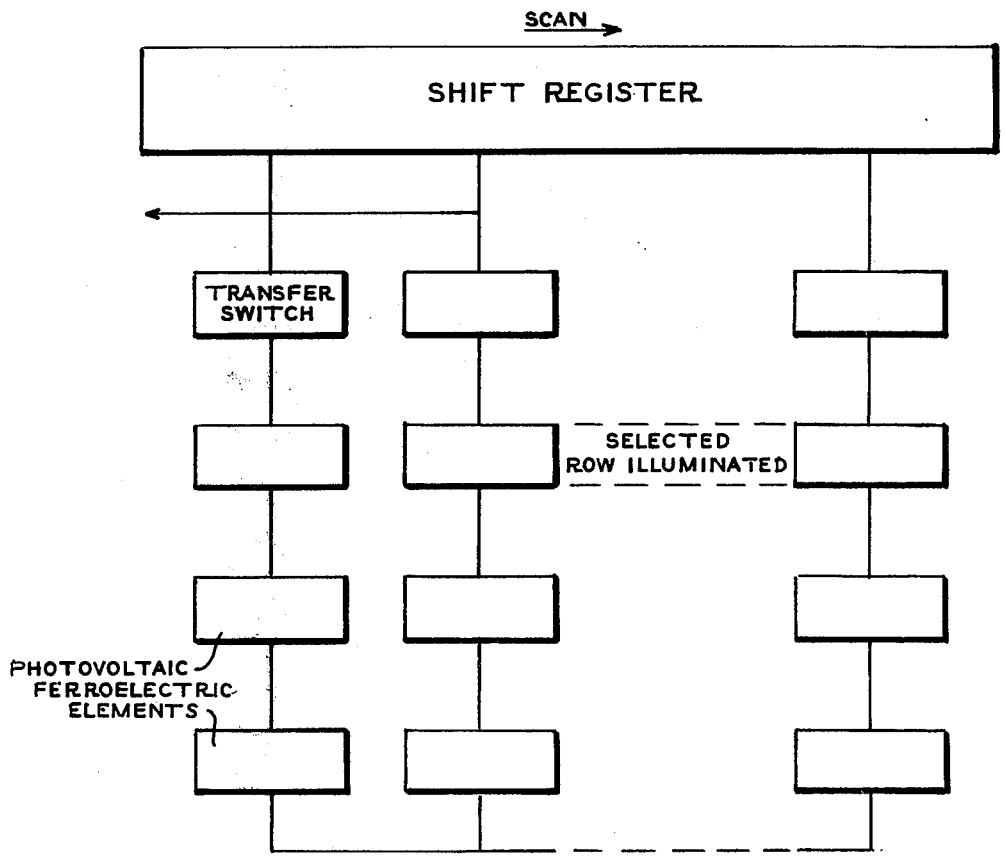

FIGS. 6 – 8 show additional embodiments of the invention in which an analog or digital data record is self-scanned. Referring to FIG. 6, cells 20 are individual photovoltaic-ferroelectric ceramic memory cells having remanent polarizations stored therein. Register 22 is a known charge control device register, which as known to those skilled in the art, is analogus in operation to a shift register in that charge is moved from one storage position to the next, and is then recirculated. Transfer gate 21 is disposed between photovoltaic-ferroelectric cells 20 and the charge control device register.

In operation, when cells 20 are illuminated, they output a signal indicative of the stored remanent polarization to the corresponding cells of the register through transger gate 21. After this is done, the information is read out along the register at the desired rate.

The ferroelectric ceramic elements can be formed directly on a silicon substrate on which the CCD registers are formed using large scale integrated circuit technology. Information can be introduced into the individual memory cells by a replication technique from a master or directly using moving electric contact, a charging electron beam, or other appropriate method.

The above-described device may be viewed either as a self-scanning data record or as a charge control memory with photovoltaic ferroelectric cells being utilized to make the stored information permanent instead of temporary. As is known to those skilled in the art, one of the problems with conventional charge control memories is that the information needs to be refreshed periodically.

In FIG. 7, another embodiment of a self-scanning device is shown, which embodiment utilizes a conventional shift register in conjunction with individual transfer switches. Referring to the Figure, individual ferroelectric ceramic elements 24 are connected through individual transfer switches 25, which may, for instance, be solid state switches, to the cells of shift register 26. In this embodiment, if desired, the shift register can be utilized to sequentially apply a fixed or varying voltage to the individual ferroelectric ceramic elements sufficient to produce remanent polarization representing information. Readout is accomplished by the reverse operation, the charge produced by the elements upon illumination being transferred to the shift register, and being shifted out to processing circuitry in conventional fashion. To represent the alternative write and read functions, pole or read switch 27 is shown. As well as being a self-scanning record, the device shown in FIG. 7 is also a sequential non-volatile read-write memory.

An extension of the embodiment of FIG. 7 is shown in FIG. 8. In this embodiment, multiple rows of ferrolectric ceramic elements are utilized in conjunction with a single transfer switch, and the individual rows are scanned by being selectively illuminated. This embodiment can be utilized as a read-only memory or as a data record. Polarization information can be entered in a variety of ways, for instance, by voltages applied through sets of electrical contacts.

Similarly, the embodiment of FIG. 6 can be extended to the multiple row concept by providing multiple rows of cells and by connecting the row cells of each column in parallel with each other. Again, either a read-only memory or a self-scanning record is provided.

It should be understood that while the storage and readout apparatus of the invention has been described, heretofore in conjunction with a disk, it also applies to tape and drum media.

I wish it to be understood that I do not desire to be limited to the exact details of construction shown and described, for obvious modifications can be made by a person skilled in the art.

What is claimed is:

1. A photovoltaic information storage and read-out apparatus comprising,
   a substrate of ferroelectric ceramic material,
   means for applying an electrical signal having a predetermined polarity across at least a region of said substrate to effect a remanent ferroelectric polarization in said region representative of said information to be stored,
   means for illuminating said at least a region of said substrate with a source of radiation, whereby a photovoltaic voltage is produced at said region having a polarity dependent on the polarity of said polarizing electrical signal, and,
   means for detecting the polarity of said photovoltaic voltage, whereby the stored information is retrieved.

2. A photovoltaic storage and read-out apparatus comprising,
   a substrate of ferroelectric ceramic material,
   means for applying an electrical signal having a predetermined magnitude across at least a region of said substrate to effect a remanent ferroelectric polarization in said region representative of said information to be stored,
   means for illuminating said at least a region of said substrate with a source of radiation, whereby a photovoltaic voltage is produced in said region having a magnitude dependent on the magnitude of said polarizing electrical signal, and,
   means for detecting the magnitude of said photovoltaic voltage, whereby the stored information is retrieved.

3. The apparatus of claim 1 wherein said substrate is disk-shaped, is deposited on a conducting surface, said means for applying an electrical signal comprises means for applying a signal to said substrate in a spiral tracking pattern.

4. The apparatus of claim 3 wherein said disk has an exposed surface and said means for illuminating comprises means for illuminating the entire exposed surface simultaneously.

5. The apparatus of claim 4 wherein said means for applying an electrical signal comprises means for applying a plurality of electrical signals in concentric spiral tracks.

6. The apparatus of claim 5, wherein said means for detecting comprises means for detecting a plurality of photovoltaic voltages in concentric spiral tracks.

7. The apparatus of claim 1 wherein said substrate comprises at least a part of a tape.

8. The apparatus of claim 1 wherein said substrate is deposited on a drum.

9. An information storage and read-out apparatus comprising,
   a plurality of cells of ferroelectric ceramic material, each cell being remanently polarized,
   means for illuminating said cells, each cell thus producing a photovoltaic voltage,
   means for parallel-transferring the voltage produced by each cell to the stages of a register means, and
   means for serially reading out the contents of said register means.

10. The apparatus of claim 9 wherein said register means comprises charge control device register means.

11. The apparatus of claim 9 wherein said register means comprises shift register means.

12. An apparatus of claim 9 wherein said plurality of cells comprises a plurality of rows and columns of cells, and said means for illuminating comprises means for illuminating a selected row at a time.

13. A method of storing information comprising,
    providing a substrate of ferroelectric ceramic material,
    applying an electrical signal having a predetermined polarity across at least a region of said substrate to effect a remanent ferroelectric polarization in said region representative of said information to be stored,
    illuminating said at least a region of said substrate with a source of radiation whereby a photovoltaic voltage is produced at said region having a polarity dependent on the polarity of said electrical signal, and
    detecting the polarity of said photovoltaic voltage, whereby said stored information is retrieved.

14. An information storage and read-out apparatus comprising,
    shift register means,
    a plurality of cells of ferroelectric ceramic material,
    a transfer switch means connected between each stage of said shift register means and a said cell voltage source means, and
    switch means connected between said voltage source means and said transfer switch means for applying a voltage from said source to said transfer switch means for transfer to said cells.

* * * * *